(12) United States Patent
Kugelman

(10) Patent No.: US 7,196,436 B2
(45) Date of Patent: Mar. 27, 2007

(54) SOLID STATE RELAY FOR SWITCHING AC POWER TO A REACTIVE LOAD AND METHOD OF OPERATING THE SAME

(75) Inventor: Michael M. Kugelman, Akron, OH (US)

(73) Assignee: Goodrich Corporation, Charlotte, NC (US)

( * ) Notice: Subject to any disclaimer, the term of this patent is extended or adjusted under 35 U.S.C. 154(b) by 333 days.

(21) Appl. No.: 10/865,362

(22) Filed: Jun. 10, 2004

(65) Prior Publication Data

US 2004/0222701 A1 Nov. 11, 2004

Related U.S. Application Data

(63) Continuation-in-part of application No. 10/803,436, filed on Mar. 18, 2004.

(60) Provisional application No. 60/460,050, filed on Apr. 3, 2003.

(51) Int. Cl.
*H01H 81/00* (2006.01)
(52) U.S. Cl. .................................... 307/141.8
(58) Field of Classification Search .............. 307/141.8
See application file for complete search history.

(56) References Cited

U.S. PATENT DOCUMENTS 5,892,677 A * 4/1999 Chang ..................... 363/152

6,163,472 A * 12/2000 Colby ....................... 363/127

(Continued)

FOREIGN PATENT DOCUMENTS

EP 0 194 249 A2 9/1986

(Continued)

OTHER PUBLICATIONS

Patents Act 1977: Search Report under Section 17 dated Oct. 10, 2005 for Application No. GB0509515.3.

(Continued)

*Primary Examiner*—Burton S. Mullins
*Assistant Examiner*—Adi Amrany
(74) *Attorney, Agent, or Firm*—Calfee, Halter & Griswold LLP; Peter M. Hernandez, Esq.

(57) ABSTRACT

A solid state relay coupleable to first and second phase busses of an AC power source for switching power from the first and second phase busses to a load including a reactive component comprises: first and second power semiconductor switches connected in a series circuit configuration and coupleable to the first and second phase busses for switching power from the first and second phase busses to the load, each of the first and second power semiconductor switches controllably operative in conductive and non-conductive states; first and second power diodes coupled respectively across the first and second power semiconductor switches; and a control circuit for monitoring a voltage across the first and second phase busses and a current of the load, and for controlling the first and second switches to a conductive state based on the monitored voltage and to a non-conductive state based on the monitored load current. A counterpart method is also disclosed.

20 Claims, 6 Drawing Sheets

U.S. PATENT DOCUMENTS 6,407,937 B2 * 6/2002 Bruckmann et al. ..... 363/56.05
6,744,650 B2 * 6/2004 Mahlein et al. ............ 363/149
6,778,414 B2 * 8/2004 Chang et al. ................. 363/67

FOREIGN PATENT DOCUMENTS

| EP | 0197658 A2 | 10/1986 |
|----|------------|---------|
| EP | 0245769 A1 | 11/1987 |
| JP | 11027126 A | 1/1999 |

OTHER PUBLICATIONS

Preliminary Search Report from French Patent Appl. No. 0505787.
Wonfor C, "Low Noise Solid State Relay" Electronics World, LEXIS Media Communications, Swanley, Kent GB, vol. 106, No. 1768, Apr. 2000, p. 293.

* cited by examiner

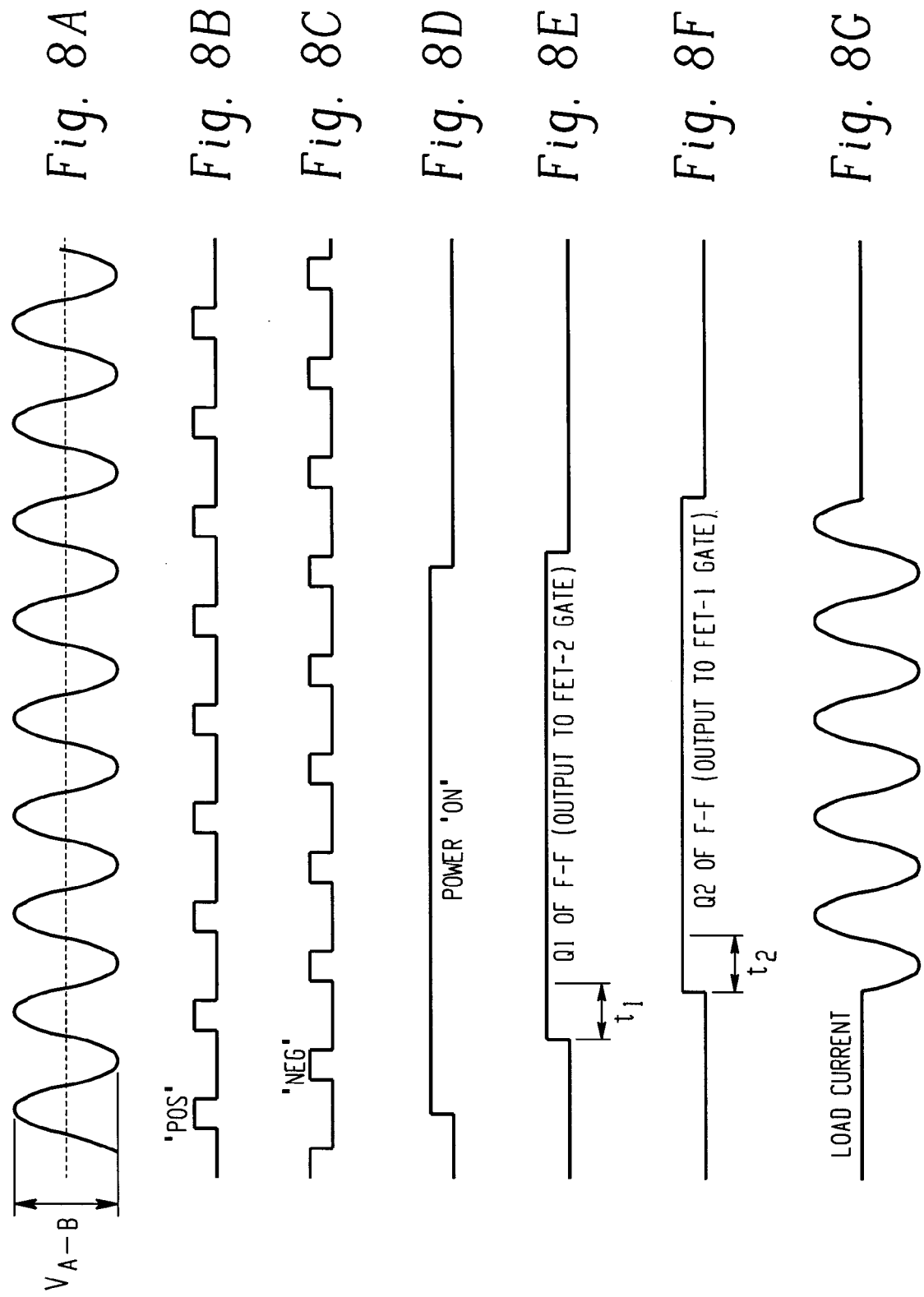

SOLID STATE RELAY FOR SWITCHING AC POWER TO A REACTIVE LOAD AND METHOD OF OPERATING THE SAME

This application is a continuation-in-part application of U.S. application Ser. No. 10/803,436, filed Mar. 18, 2004 which claims priority from U.S. Provisional Application Ser. No. 60/460,050 filed Apr. 4, 2003.

BACKGROUND OF THE INVENTION

The present invention is related to solid state AC power switching, in general, and more particular, to a solid state relay for switching AC power to a load, including a reactive component, with reduced electromagnetic interference (EMI) or noise, and a method of operating the same.

With the increased use of electronic/computerized control and instrumentation systems on-board aerospace vehicles, it has become increasingly important to minimize the electromagnetic interference (EMI) or noise that is generated when switching AC power to electrical loads. Such EMI may have an adverse effect on the avionics, especially when generated over the AC power lines. Back-to-back solid-state switches, like field effect transistors (FETs), for example, have been used in solid-state relays (SSRs) for AC power switching in a variety of applications. Heretofore, these applications attempt to control the solid-state switches or FETs of the SSR simultaneously at zero voltage across the FET switches and/or at zero current therethrough. Due to inaccuracies of timing, exact switching at zero voltage and/or zero current is not effected which causes EMI to be inherently generated by the AC power switching. These timing inaccuracies are exacerbated when the power frequency is varying or unknown.

What is needed then is a solid-state relay that overcomes the drawbacks of the current solid-state relays by permitting AC power switcing with minimal generation of EMI. A solid-state relay that is not dependent on switching timing accuracy or constant or known power frequencies is highly desirable.

SUMMARY OF THE INVENTION

In accordance with one aspect of the present invention, a solid state relay coupleable to first and second phase busses of an AC power source for switching power from the first and second phase busses to a load including a reactive component comprises: first and second power semiconductor switches connected in a series circuit configuration and coupleable to the first and second phase busses for switching power from the first and second phase busses to the load, each of the first and second power semiconductor switches controllably operative in conductive and non-conductive states; first and second power diodes coupled respectively across the first and second power semiconductor switches; and a control circuit for monitoring a voltage across the first and second phase busses and a current of the load, and for controlling the first and second switches to a conductive state based on the monitored voltage and to a non-conductive state based on the monitored load current.

In accordance with another aspect of the present invention, a method of switching power from first and second phase busses of an AC power source to a load including a reactive component comprises the steps of: connecting first and second power semiconductor switches in a series circuit configuration and coupling the series circuit configuration to first and second phase busses for switching power from the first and second phase busses to the load; coupling first and second power diodes respectively across the first and second power semiconductor switches; monitoring a voltage across the first and second phase busses and a current of the load: and controlling the first and second switches to a conductive state based on the monitored voltage and to a non-conductive state based on the monitored load current.

BRIEF DESCRIPTION OF THE DRAWING

FIGS. 8A–8G depict time waveforms suitable for describing an exemplary operation of the circuits depicted in FIGS. 6 and 7.

DETAILED DESCRIPTION OF THE INVENTION

Figure 1:
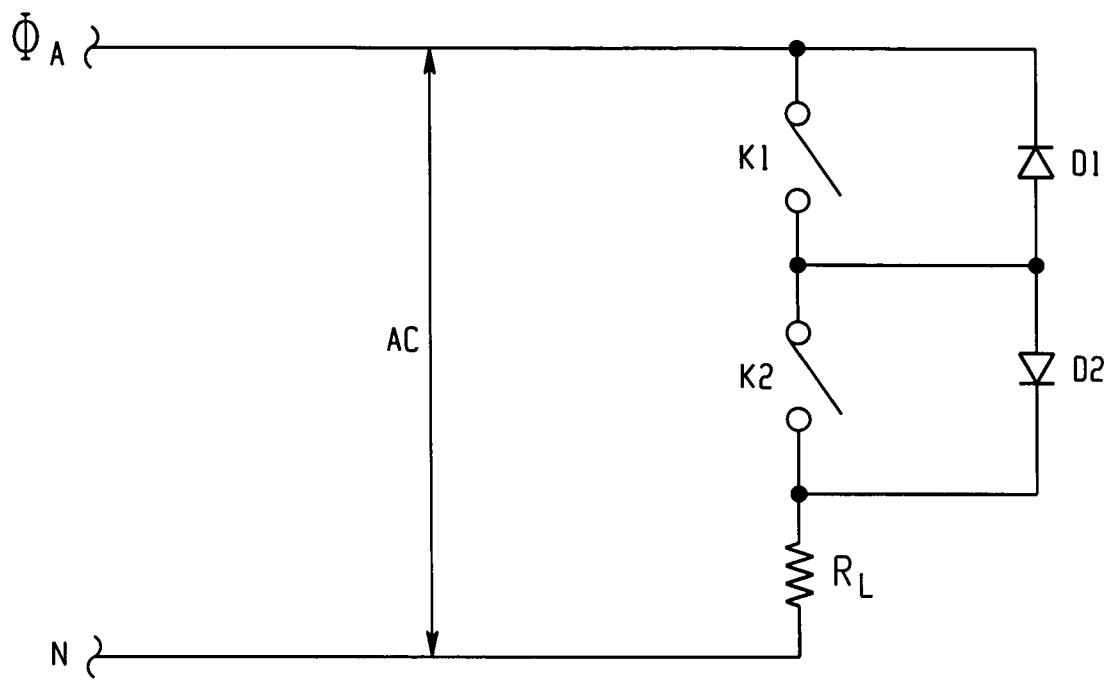
FIG. 1 is a circuit schematic of a conceptual embodiment of the present invention.
Figure 2:
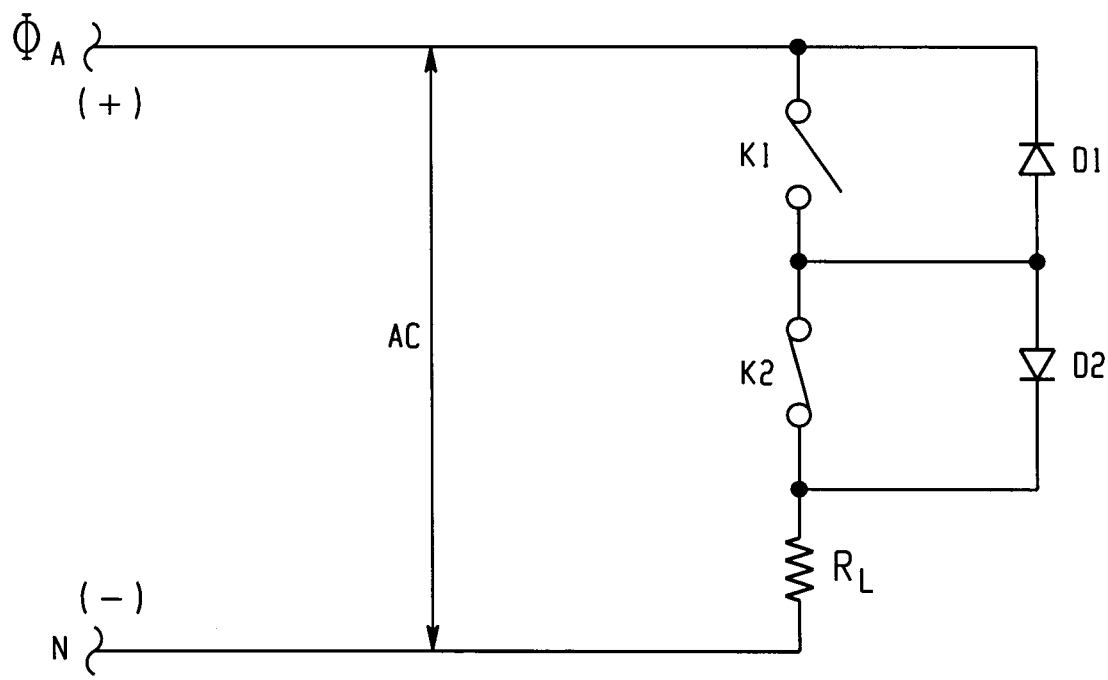
FIGS. 2–5 depict different circuit configurations of the embodiment of FIG. 1 for the purposes of describing an exemplary operation thereof.
Figure 3:
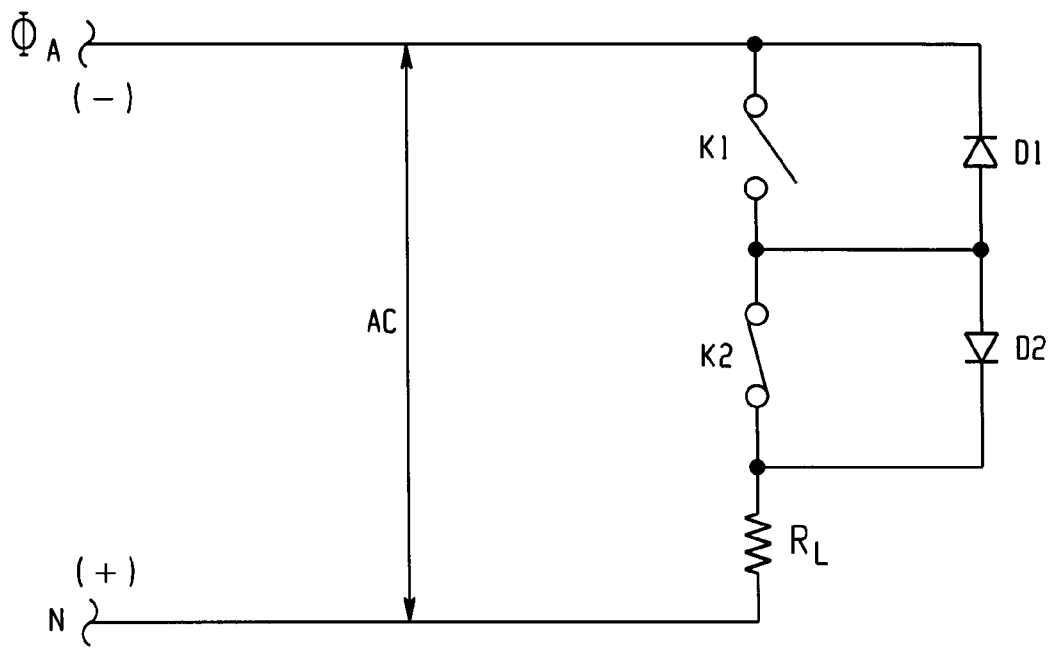

FIG. 1 is a circuit diagram of a conceptual embodiment of the present invention. Referring to FIG. 1, dual switches K1 and K2 are coupled in series with a load $R_L$ across an AC power source. The switches K1 and K2 are representative of solid-state switches which may be electronically controlled as will become more evident from the description found herein below. In the present embodiment, the AC power source is generated across one phase $\Phi_A$ and neutral N which provides an RMS AC voltage of approximately 115 volts, for example. However, it is understood that the AC power source may be also generated across two phases of a three phase or multi-phase power source in which case the AC voltage may be on the order of 200 volts RMS or greater, for example. If applied to an airborne vehicle, the frequency of the AC power source may be around 400 Hertz, but may vary anywhere from 300 to 800 Hertz, for example. Actually, the present embodiment may operate at frequencies in the thousands of Hertz.

Also in the present embodiment, a power diode D1 is coupled in parallel across switch K1 in a configuration to block current when the $\Phi_A$ voltage potential is positive with respect to the N voltage potential and another power diode D2 is coupled in parallel across switch K2 in a configuration to block current when the $\Phi_A$ voltage potential is negative with respect to the N voltage potential. In the embodiment of FIG. 1, a solid-state relay (SSR) comprises switches K1 and K2 and power diodes D1 and D2. Accordingly, the circuit embodiment of FIG. 1 permits operation of switches K1 and K2 to conduct and block current through the load $R_L$ from the AC power source with minimal generation of EMI by utilizing the parallel coupled power diodes D1 and D2.

FIGS. 1–5 depict different circuit configurations illustrating an operation of the present embodiment in accordance with the broad principles of the present invention. In the circuit configuration of FIG. 1, it is presumed that the SSR is turned off or disabled, both switches K1 and K2 are not conducting and the diodes D1 and D2 are blocking current from passing through the load. In the circuit configuration of FIG. 2, the SSR is enabled or turned on and as $\Phi_A$ becomes positive with respect to N, one of the switches K2, for example, is controlled to a closed or conducting state.

However, in this state, diode D1 continues to block current through the load from $\Phi_A$ to N. In the circuit configuration of FIG. 3, with the SSR enabled or turned on, as the voltage polarity of $\Phi_A$ changes from positive to negative with respect to N, current begins gradually to flow through the load via switch K2 which had been closed and conducting diode D1. In this state, the other of the switches K1 is controlled to a closed or conducting state. Over the time period switch K1 is closing, load current gradually transitions from diode D1 to switch K1. In the circuit configuration of FIG. 4, switch K1 finally closes. Thus, the parallel coupled diode D1 allows load current to flow initially until switch K1 is able to conduct the full load current as $\Phi_A$ changes from positive to negative with respect to N. Note that as K1 starts conducting, there is a smooth transition of the load current from D1 to K1. As a result, little or no EMI is generated during the switching of the AC power from off to on through the load.

Figure 4:
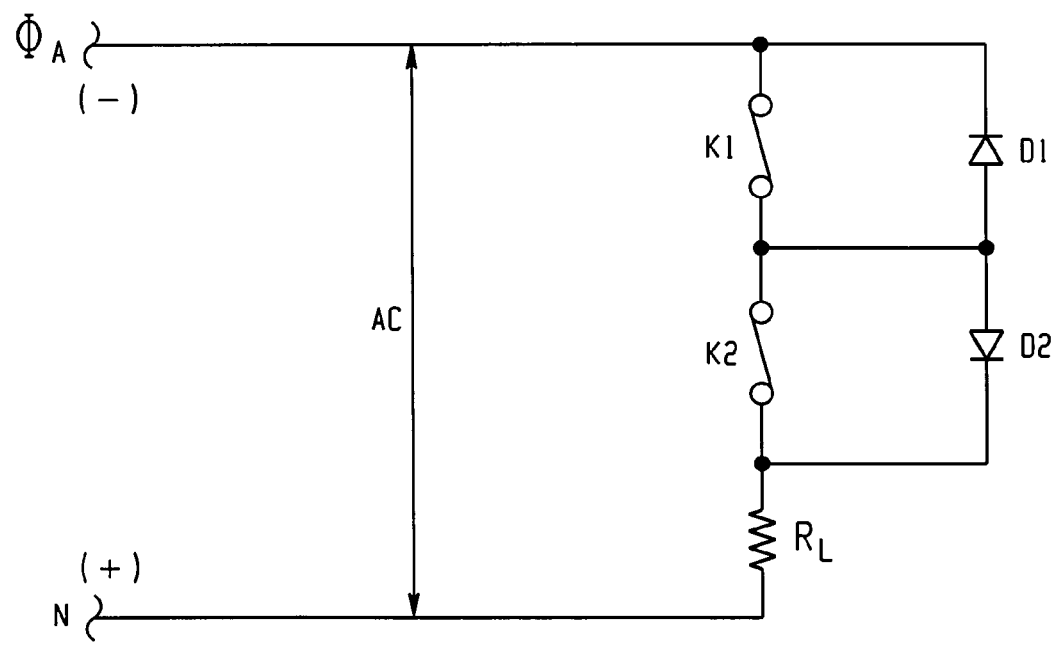
Figure 5:
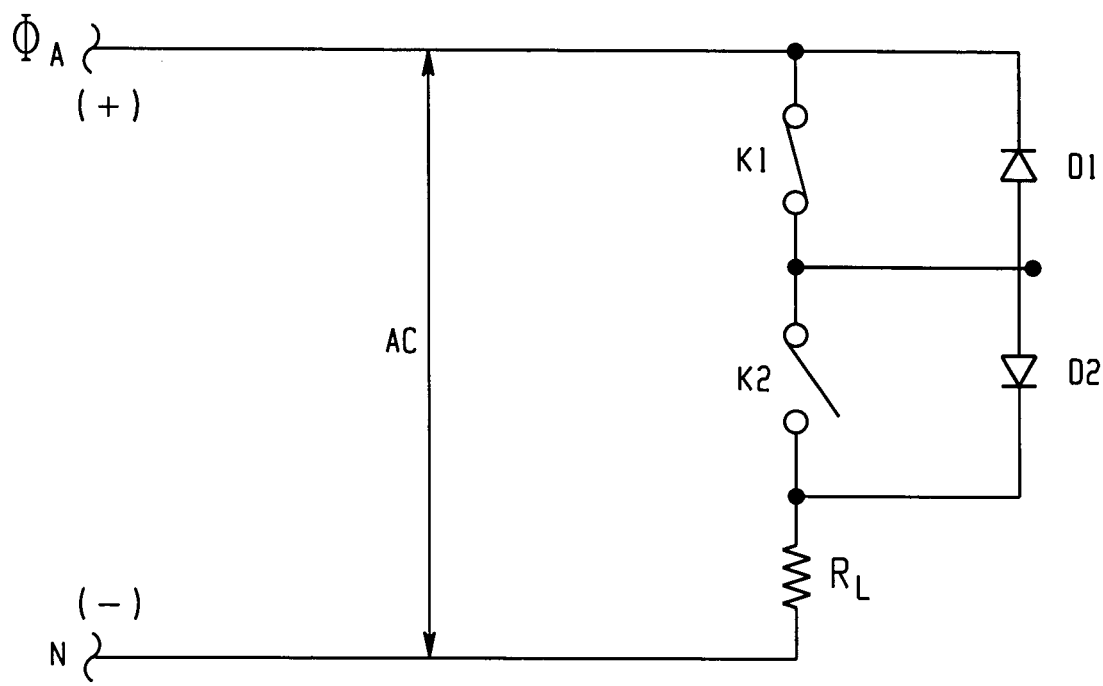

Should the SSR be turned off in the circuit configuration of FIG. 4, as $\Phi_A$ becomes positive with respect to N, one of the switches K2 is controlled open while the other switch K1 remains closed as shown in FIG. 5, but load current continues to flow through the parallel coupled diode D2. That is, as switch K2 is opening, the load current gradually transitions from switch K2 to diode D2. Then, as $\Phi_A$ becomes negative with respect to N, diode D2 blocks the load current. While $\Phi_A$ is negative with respect to N, switch K1 may be opened without affecting current flow which is already blocked by diode D2. As a result, little or no EMI is generated during the switching of the AC power from on to off through the load. In addition, utilizing the parallel coupled diodes D1 and D2 eliminates substantially the critical zero crossing timing heretofore needed to switch the AC power on and off to the load. The parallel coupled diodes inherently commutate on and off to conduct and block load current as the respective switch is turned on and off at any frequency of the AC power source.

Figure 6:
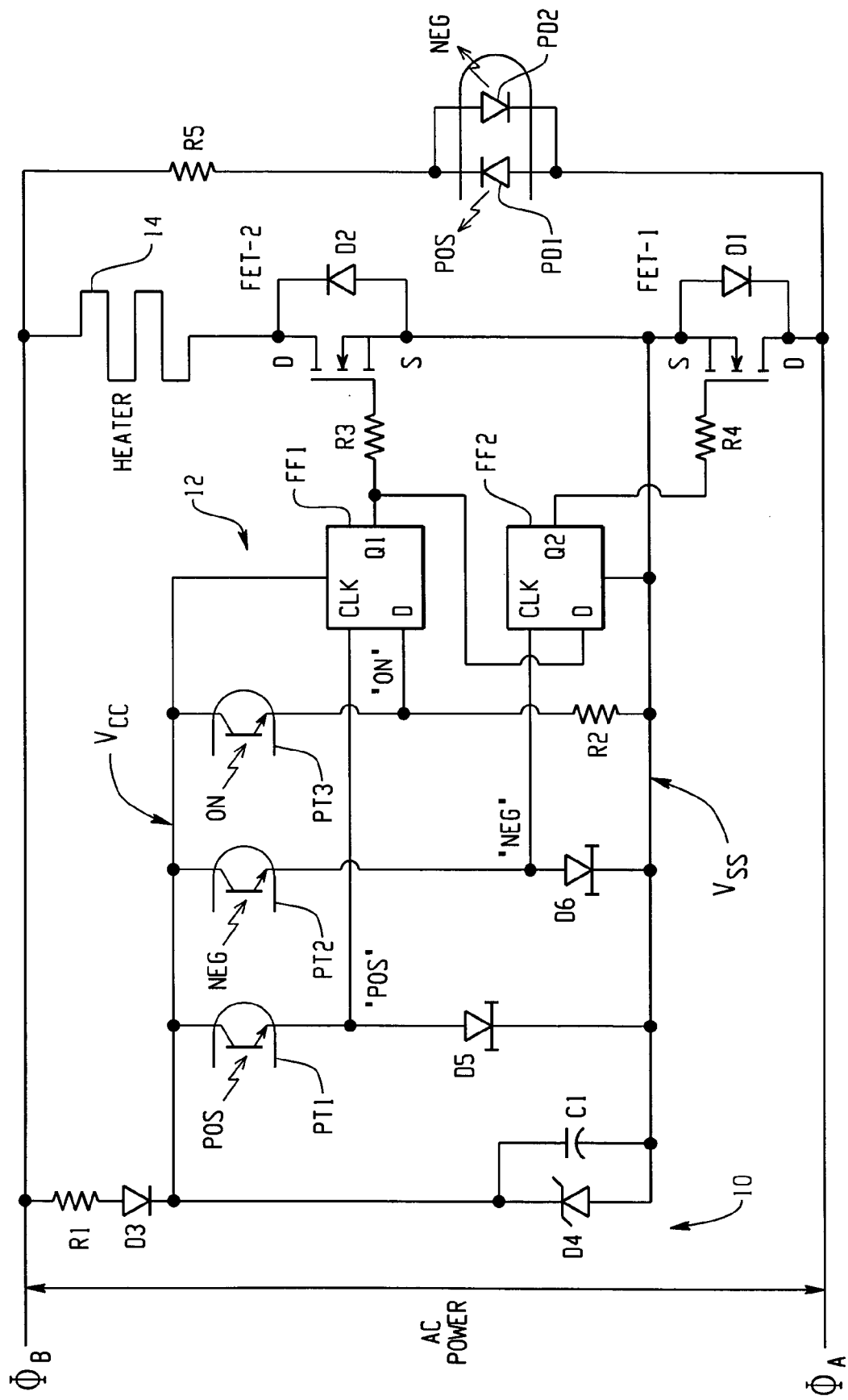

FIG. 6 is a circuit schematic of a more detailed embodiment of the present invention. Referring to FIG. 6, a floating DC power supply 10 is created between the voltages busses $\Phi_A$ and $\Phi_B$ of the AC power source. Phase $\Phi_B$ may be the neutral bus N or another phase of a multi-phase power source. In the present embodiment, the solid-state switches K1 and K2 as described in connection with FIG. 1 are embodied by power N-type, metal oxide semiconductor (MOS) FETs FET-1 and FET-2, respectively, which may be of the type manufactured by Advanced Power Technology under the model no. APT5015, for example. Each APT 5015 package includes a power diode coupled across the FET anode-to-source (S) and cathode-to-drain (D). That is, diode D1 is coupled across FET-1 and diode D2 is coupled across FET-2. The switches FET-1 and FET-2 are coupled together in series at the source junctions thereof and together coupled across the busses $\Phi_A$ and $\Phi_B$ in series with the load $R_L$ 14 which in the present embodiment is a heater element, for example.

The floating power supply 10 comprises a resistor R1 having one end coupled to the $\Phi_B$ (phase B) power bus and the other end coupled to the anode of a diode D3. The cathode of diode D3 is coupled to the cathode of a zener diode D4 which may be a 12V zener, for example, and one side of a capacitor C1 which is coupled in parallel across the zener D4. The anode of D4 is coupled to the source junction of FET-1 and the anode of D1. The drain junction of FET-1 and cathode of D1 are coupled to the $\Phi_A$ (phase A) bus. Accordingly, each time the phase B bus goes positive with respect to the phase A bus, current is passed through the series connection of components R1, D3, D4, and D1 (half-wave rectification) and is limited by the resistance of R1 which for the present embodiment may be on the order of 20K ohms, for example, and the voltage developed thereacross. This current charges capacitor C1 which may be on the order of 10 microfarads, for example, to the voltage of the zener which may be 12 volts. Diodes D1 and D3 prevents C1 from discharging back to the phase B bus when it goes negative with respect to the phase A bus. The voltage across C1 is the voltage of the floating power supply 10. DC supply lines Vcc and Vss of the floating supply 10 are coupled to the positive and negative sides of C1, respectively.

Logic circuitry 12 for controlling the switching of switches FET-1 and FET-2 is coupled across the supply lines Vcc and Vss of the floating power supply 10. In the present embodiment, the collectors of separate photo-transistors PT1, PT2 and PT3 are coupled to the Vcc bus. The emitter of PT1 is coupled in series with a constant current sink diode D5 to the Vss bus and the emitter of PT2 is coupled in series with another constant current sink diode D6 to the Vss bus. The constant current sink diodes D5 and D6 may be of the type bearing model no. 1N5297, for example, and may conduct a predetermined current which may be on the order of 1 milliamp, for example. Each diode D5 and D6 acts as a switch which turns on to produce a substantially sharp rising edge voltage across the diode as the conduction current reaches the predetermined level. Prior to the conduction current reaching the predetermined level, the voltage across each diode D5 and D6 remains at substantially zero. Corresponding photodiodes PD1 and PD2 are coupled in parallel with each other and the parallel combination is coupled in series with a current limiting resistor R5 across the phase A and phase B busses. The photodiodes PD1 and PD2 may be embedded with their corresponding phototransistors PT1 and PT2 in a common dual optocoupler package which may be of the type manufactured by Fairchild under the model MCT 62, for example.

During the half-wave cycles of the AC power supply in which the phase A bus is positive with respect to the phase B bus, current passes through PD1 which produces light denoted as "POS" in response thereto. The POS light signal is optically coupled to the corresponding transistor PT1 to cause PT1 to conduct current through the diode D5. Likewise, during the half-wave cycles of the AC power supply in which the phase A bus is negative with respect to the phase B bus, current passes through PD2 which produces light denoted as "NEG" in response thereto. The NEG light signal is optically coupled to the corresponding transistor PT2 to cause PT2 to conduct current through the diode D6.

Figure 7:
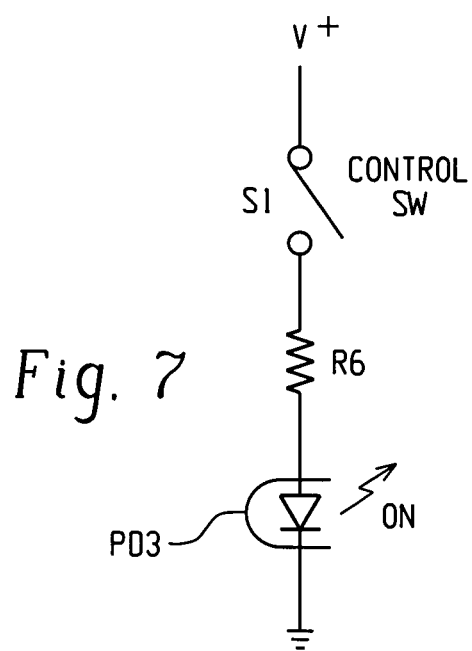
FIGS. 6 and 7 are more detailed circuit schematics of the embodiment of FIG. 1.

Referring to FIG. 7, a photodiode PD3 corresponding to PT3 may be coupled in series with a switch S1 and a current limiting resistor R6 between a voltage source V+ and ground. The switch S1 may be a solid-state switch or an electromechanical switch operated by a controller, like a temperature controller, for example, for turning the SSR on and off to control temperature via the heater element. Switch S1 may be also a manually operated mechanical switch just as well. When switch S1 is operated to a conducting state, current passes through PD3 and PD3 generates light denoted as "ON" in response thereto. The PD3 and corresponding PT3 may be also packaged in a common opto-coupler component, like an MCT 62, for example. Referring back to FIG. 6, the emitter of PT3 is coupled in series with a resistor R2 to the Vss bus. Accordingly, the light "ON" is optically coupled to PT3 and causes PT3 to conduct current from bus Vcc through resistor R2 to the bus Vss thus causing a positive voltage to be developed across resistor R2 with respect to Vss. In this manner, the logic 12 powered by the floating power supply 10 is totally isolated from the source of the control signals POS, NEG and ON via the optical coupling thereof.

Also, in the embodiment of FIG. 6, the anode of D5 is coupled to a clock input denoted as CLK of a D-type flip-flop FF1 and the connecting node between the emitter of PT3 and resistor R2 is coupled to a data input denoted as D of FF1. An output Q1 of FF1 is coupled to the gate junction of FET-2 through a resistor R3 and coupled to a D input of another D-type flip-flop FF2. Further, the anode of D6 is coupled to a CLK input of FF2 and an output Q2 of FF2 is coupled to the gate junction of FET-1 through a resistor R4. Each flip-flop FF1 and FF2 is powered by the floating power supply via busses Vcc and Vss and operates to transfer the status of the signal at the D input thereof to the output Q at the occurrence of a leading edge pulse at the CLK input and thereafter maintains the output Q until the next occurrence of a leading edge pulse at the CLK input.

An operation of the embodiment described in connection with FIGS. 6 and 7 will now be described utilizing the exemplary time waveforms of FIGS. 8A–8G. In operation, the switches FET-1 and FET-2 of the SSR are controlled by the logic circuitry 12 to switch the AC power supply (see FIG. 8A) to the load or heater element 14. To achieve this objective, the opto-coupler PD1/PT1 causes a pulse denoted as POS at the CLK input of FF1 during the times when the phase A bus is positive with respect to the phase B bus as shown in FIGS. 8A and 8B. Likewise, the opto-coupler PD2/PT2 causes a pulse denoted as NEG at the CLK input of FF2 during the times when the phase A bus is negative with respect to the phase B bus as shown in FIGS. 8A and 8C. Note that until the SSR is enabled, the outputs Q1 and Q2 of the flip-flops FF1 and FF2 will remain in a low or non-positive state in response to the POS and NEG pulses. In these Q1 and Q2 states, switches FET-1 and FET-2 will remain open or non-conducting.

The SSR may be enabled to couple the AC power supply to the load via control of switches FET-1 and FET-2 by closing switch S1 which controls the opto-coupler PD3/PT3 to create a high or positive pulse denoted as ON at the D input of FF1. As shown in FIG. 8D, pulse ON will remain in effect until switch S1 is opened. After enabling the SSR and at the leading edge of the next POS pulse, representative of a positive half-wave of the phase A bus, the FF1 generates a high or positive state at Q1 as shown by FIG. 8E. The positive state at Q1 drives the switch FET-2 to begin closing and is provided to the D input of FF2. It may take a duration of time t1 within the positive half-wave cycle of the phase A bus for FET-2 to become fully conducting. In the present embodiment, time t1 may be approximately 300 microseconds, for example. Note that this closure of FET-2 will prepare for, but not permit current to be conducted to the load 14 since FET-1 remains open and diode D1 is in a blocking state.

However, as soon as the phase A bus becomes negative with respect to the phase B bus, diode D1 starts conducting current to the load 14 via previously closed switch FET-2 as shown in FIG. 8G. At the leading edge of the next NEG pulse, representative of a negative half-wave of the phase A bus, the FF2 generates a high or positive state at Q2 (since D input is in a positive state) as shown by FIG. 8F. The positive state at Q2 drives the switch FET-1 to begin closing. It may take a duration of time t2 within the negative half-wave cycle of the phase A bus for FET-2 to become fully conducting. In the present embodiment, time t2 may be approximately 300 microseconds, for example. As FET-1 closes, load current gradually transitions from D1 to FET-1. Thus, when FET-1 is fully closed at the end of t2, it is conducting all of the load current.

The SSR may be disabled to decouple the AC power supply from the load via control of switches FET-1 and FET-2 by opening switch S1 which controls the optocoupler PD3/PT3 to drop the ON pulse at the D input of FF1 as shown in FIG. 8D. The pulse ON will remain low thereafter until switch S1 is closed again. At the leading edge of the next POS pulse, after disabling the SSR, the FF1 generates a low or non-positive state at Q1 as shown by FIGS. 8B and 8E. The low state at Q1 drives the switch FET-2 to begin opening and is provided to the D input of FF2. It may take a duration of time for FET-2 to become fully open or non-conducting. Note that this opening of FET-2 will prepare for, but not block current being conducted to the load 14 (see FIG. 8G) since FET-1 remains closed and load current transitions to diode D2 which is in a conducting state. However, as soon as the phase A bus becomes negative with respect to the phase B bus, diode D2 becomes non-conducting. With D2 non-conducting and FET-2 open, current to the load 14 is blocked as shown in FIG. 8G. Also, as the phase A bus becomes negative, the NEG pulse is generated (see FIG. 8C) which triggers the output Q2 of the FF2 to a low or non-positive state which drives FET-1 to an open or blocking state.

Figure 9:
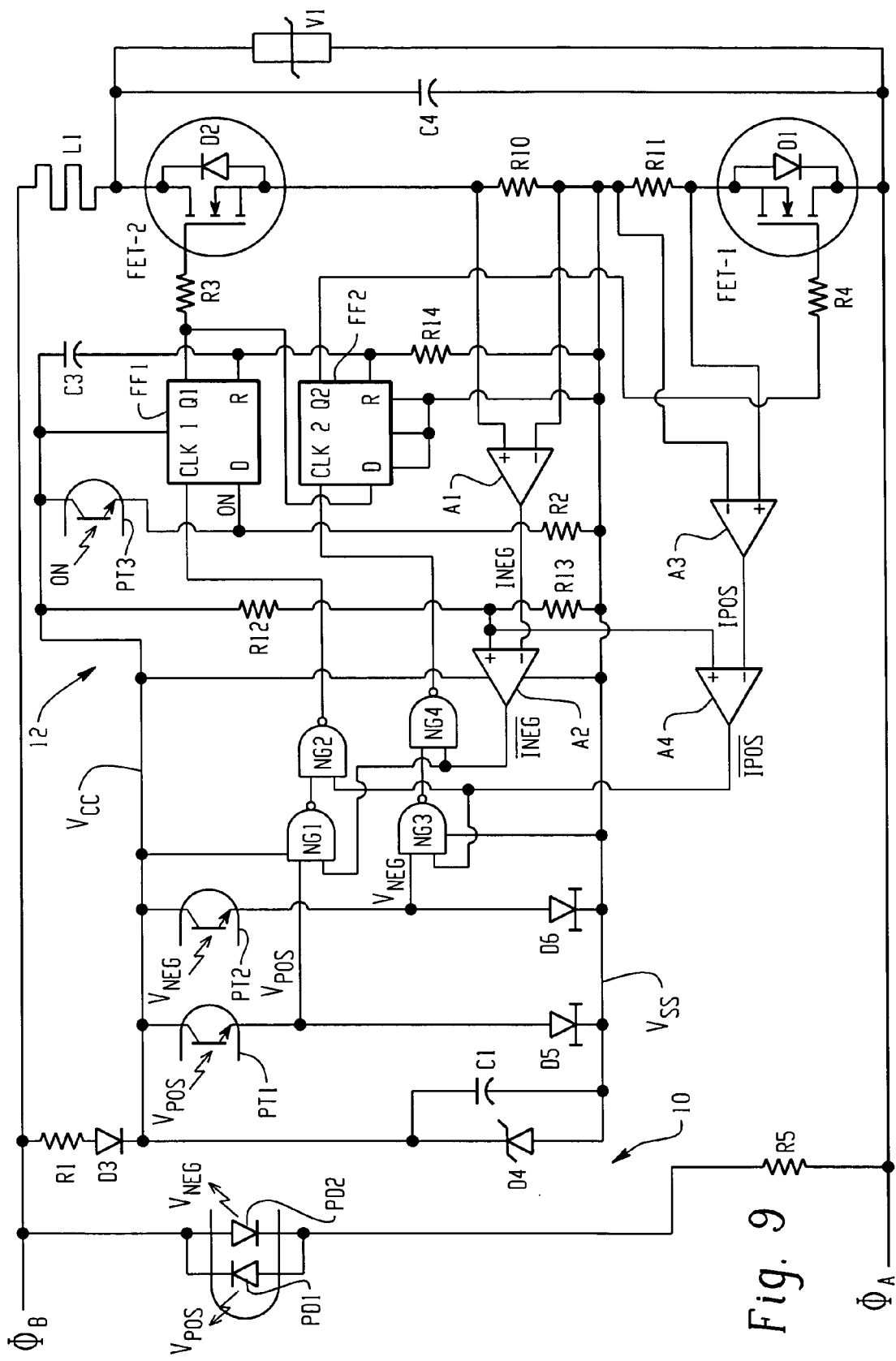
FIG. 9 is a circuit schematic of an alternate embodiment of the present invention.

While the SSR embodiment described herein above is suitable for controlling AC power to a resistive load with low emissions of EMI, it is understood that it may also control AC power to loads other than resistive loads with minor modifications. To minimize EMI emissions for loads including a substantial reactive component, like an inductive load, for example, wherein the load current is out of phase with the supply voltage, it is desired to switch on the load current at the zero crossing of the supply voltage and switch off the load current at the zero crossing of the load current. A suitable embodiment for modifying the SSR described in connection with FIG. 6 is shown in the circuit schematic of FIG. 9. In FIG. 9, those circuit elements common to the SSR embodiment of FIG. 6 will retain the same reference character.

Referring to FIG. 9, the exemplary modification includes four NAND gates NG1–NG4 which may be contained in a single integrated circuit (IC) package and four operational amplifiers A1–A4 which may be also contained in a single IC package. Both the gate and operational amplifier IC packages are powered by the Vcc and Vss buses. Shunt resistors R10 and R11 are added in series with a reactive load L1 between the switches FET-1 and FET-2. Resistor R10 may be added between the Vss bus and FET-2 and resistor R11 may be added between the Vss bus and FET-1, for example. An inverting (−) input of amplifiers A1 and A3 are coupled to Vss bus side of the resistors R10 and R11, respectively. The other side of resistors R10 and R11 are coupled to non-inverting (+) inputs of amplifier A1 and A3, respectively.

The outputs of A1 and A3 are coupled respectively to inverting (−) inputs of amplifiers A2 and A4. A voltage divider network comprising resistors R12 and R13 is coupled across the buses Vcc and Vss to create a reference voltage at the node between R12 and R13 which is coupled to non-inverting (+) inputs of both amplifiers A2 and A4. The output of A2 is coupled to one input of gates NG1 and NG4 and operates as an enable signal thereto, and the output of A4 is coupled to one input of gates NG2 and NG3 and operates as an enable signal thereto. The Vpos and Vneg signals are coupled to the other input of gates NG1 and NG3, respectively, and the outputs of NG1 and NG3 are coupled respectively to the other input of gates NG2 and NG4. The outputs of NG2 and NG4 are coupled to the clk1 and clk2 inputs of the flip flops FF1 and FF2, respectively. Also added across the buses Vcc and Vss is a power-on reset circuit comprising a series combination of capacitor C3 and resistor R14. The node between C3 and R14 is coupled to a reset input of the flip-flop circuits FF1 and FF2 to ensure the starting state of the outputs Q1 and Q2 thereof are reset to zero at power turn on.

In the alternate embodiment, amplifiers A1 and A3 operate as differential amplifiers producing signals INEG and IPOS at their outputs representative of the load currents of resistors R10 and R11, respectively. Amplifiers A2 and A4 operate as comparator circuits which compare the current representative signals INEG and IPOS of A1 and A3 to the voltage at the node of the resistors R12 and R13 which may be representative of a zero current level, for example. Accordingly, the comparators A2 and A4 produce logic signals INEG (bar) and IPOS (bar) representative of zero negative and zero positive load currents, respectively. Thus, the gate NG1 is disabled by the output of A2 at negative load current other than zero, and the gate NG3 is disabled by the output of A4 at positive load current other than zero. Note that all gates NG1–NG4 are enabled when the load current is zero.

The alternate embodiment of FIG. 9 operates as follows: at the start of the ON pulse produced by PD3/PT3, there is no load current (i.e. all gates NG1–NG4 enabled) and the circuit operates in much the same manner as described for the circuit embodiment of FIG. 6, i.e. gates NG1–NG2 are transparent and the signals Vpos and Vneg operate the clock inputs of FF1 and FF2 directly. Accordingly, the load current will be switched on by the switch/diode configurations FET-1/D1 and FET-2/D2 at or substantially close to the zero crossing of the supply voltage. Once the load current is switched on, the amplifiers A1 and A2 produce their load current representative signals INEG and IPOS via resistors R10 and R11 and in turn, the amplifiers A2 and A4 produce the logic signals INEG (bar) and IPOS (bar), respectively.

In this state, the gates NG1 and NG3 are disabled by the logic signals INEG (bar) and IPOS (bar), respectively, and will not respond to the logic signals Vpos and Vneg. When gates NG1 and NG3 are disabled, gates NG2 and NG4 will respond to the logic signals INEG (bar) and IPOS (bar), respectively, which are representative of the phase states of the load current. Therefore, once the load current is switched on, the supply voltage logic signals are ignored and the phase states of the load current will control the clock inputs to FF1 and FF2. So, when the logic signal ON is switched to a low state to switch off the current to the load L1, the load current logic signals IPOS (bar) and INEG (bar) will control (via NG2/FF1 and NG4/FF2, respectively) the turning off of the switches FET-2 and FET- 1 at or close to a zero load current transition or crossing instead of the zero supply voltage crossing.

Also a capacitor C4 and a varactor V1 may be added to the SSR embodiment, if desired. In the present embodiment, the capacitor C4 and a varactor V1 are coupled in parallel across the series switch arrangement FET-1 and FET-2 between the load L1 and phase A of the AC supply. The varactor V1 functions to protect the circuit against voltage spikes and the function of capacitor C4 is to provide some filtering of the current waveform.

Thus, the circuit modifications of the alternate embodiment ensures that the load current will be switched on at the zero crossing of the supply voltage and switched off at the zero crossing of the load current, thereby minimizing the EMI emissions for loads including reactive components. Also, since the load current signals of the alternate embodiment depend on the value of the load current, the shunt resistors R10 and R11 may be appropriately sized for several ranges of load current. Moreover, if the load current is insufficient for use by the modification circuitry, the alternate embodiment will default automatically to the operational mode of the embodiment of FIG. 6.

Note that the SSR of the present invention creates no sharp load current transitions in switching the power supply to and from the load 14. Thus, the SSR is operational with little or substantially no EMI generation due to switching. Also, since the SSR of the present invention is not sensitive to zero switching timing, it may operate at varying frequencies of the AC power supply. Still further, while the solid-state switches were embodied with MOSFETs in the present example, it is understood that other types of solid-state switches may be used, such as power bipolar transistors, insulated gate bipolar transistors (IGBTs) and the like, for example, without deviating from the broad principles of the present invention. Accordingly, the present invention should not be limited to any single embodiment, but rather construed in breadth and broad scope in accordance with the recitation of the appended claims.

What is claimed is:

1. A solid state relay coupleable to first and second phase busses of an AC power source for switching power from said first and second phase busses to a load including a reactive component, said solid relay comprising:

first and second power semiconductor switches connected in a series circuit configuration and coupleable to said first and second phase busses for switching power from said first and second phase busses to said load, each of said first and second power semiconductor switches controllably operative in conductive and non-conductive states;

first and second power diodes coupled respectively across said first and second power semiconductor switches; and a control circuit for monitoring a voltage across said first and second phase busses and a current of said load, said control circuit, upon being enabled, operative to control said first and second switches sequentially to a conductive state based on said monitored voltage and, upon being disabled, operative to control said first and second switches sequentially to a non-conductive state based on said monitored load current.

2. The relay of claim 1 wherein the first and second power diodes are coupled respectively across the first and second power semiconductor switches in a circuit configuration to block current to the load when both of the first and second power semiconductor switches are in a non-conductive state.

3. The relay of claim 2 wherein the series circuit configuration of the first and second power semiconductor switches is coupled in serieswith the load; and wherein the series circuit configuration of the load and first and second power semiconductor switches is coupled across the first and second phase busses.

4. The relay of claim 1 wherein the control circuit is governed by an enable signal to control the first semiconductor switch to a conductive state based on a monitored voltage transition between a first polarity and a second polarity and, thereafter, to control the second semiconductor switch to a conductive state based on a monitored voltage transition between the second polarity and the first polarity.

5. The relay of claim 1 wherein the control circuit is governed by a disable signal to control the first semiconductor switch to a non-conductive state based on a monitored load current transition between a first polarity and a second polarity and, thereafter, to control the second semiconductor switch to a non-conductive state based on a monitored load current transition between the second polarity and the first polarity.

6. The relay of claim 1 wherein the control circuit includes: a first circuit for monitoring the voltage across said first and second phase busses and generating logic voltage signals representative of first and second polarities thereof; a second circuit for monitoring the load current and generating logic current signals representative of first and second polarities thereof; and a third circuit for controlling the first and second switches based on said logic voltage signals and logic current signals.

7. The relay of claim 6 wherein the second circuit is operative to generate the logic current signals when the monitored load current is above a predetermined level.

8. The relay of claim 7 wherein the third circuit is operative to respond to the logic voltage signals when the monitored load current is below the predetermined level.

9. The relay of claim 7 wherein the third circuit is operative to respond to the logic current signals when the monitored load current is above the predetermined level.

10. The relay of claim 6 wherein the second circuit comprises at least one resistor in series with the load.

11. A method of switching power from first and second phase busses of an AC power source to a load including a reactive component, said method comprising the steps of:
connecting first and second power semiconductor switches in a series circuit configuration and coupling said series circuit configuration to first and second phase busses for switching power from said first and second phase busses to said load;
coupling first and second power diodes respectively across said first and second power semiconductor switches;
monitoring a voltage across said first and second phase busses and a current of said load:
enabling said solid state relay to supply power from said first and second phase busses to said load;
disabling said solid state relay from supplying power from said first and second phase busses to said load;
upon said solid state relay being enabled, controlling said first and second switches sequentially to a conductive state based on said monitored voltage; and
upon said solid state relay being disabled, controlling said first and second switches sequentially to a non-conductive state based on said monitored load current.

12. The method of claim 11 wherein the first and second power diodes are coupled respectively across the first and second power semiconductor switches in a circuit configuration to block current to the load when both of the first and second power semiconductor switches are in a non-conductive state.

13. The method of claim 12 including the steps of: coupling the series circuit configuration of the first and second power semiconductors witches in series with the load; and coupling the series circuit configuration of the load and first and second power semiconductor switches across the first and second phase busses.

14. The method of claim 11 including the step of: upon being enabled, controlling the first semiconductor switch to a conductive state based on a monitored voltage transition between a first polarity and a second polarity and thereafter, controlling the second semiconductor switch to a conductive state based on a monitored voltage transition between the second polarity and the first polarity.

15. The method of claim 11 including the step of: upon being disabled, controlling the first semiconductor switch to a non-conductive state based on a monitored load current transition between a first polarity and a second polarity, and thereafter, controlling the second semiconductor switch to a non-conductive state based on a monitored load current transition between the second polarity and the first polarity.

16. The method of claim 11 including the steps of:
monitoring the voltage across the first and second phase busses and generating logic voltage signals representative of first and second polarities thereof; monitoring the load current and generating logic current signals representative of first and second polarities thereof; and controlling the first and second switches based on said logic voltage signals and logic current signals.

17. The method of claim 16 including generating the logic current signals when the monitored load current is above a predetermined level.

18. The method of claim 17 including responding to the logic voltage signals to control the first and second switches when the monitored load current is below the predetermined level.

19. The method of claim 17 including responding to the logic current signals to control the first and second switches when the monitored load current is above the predetermined level.

20. The method of claim 16 wherein the step of monitoring the load current comprises monitoring the voltage across at least one resistor in series with the load.

* * * * *